(12) United States Patent
Smalén et al.

(10) Patent No.: US 6,305,464 B1
(45) Date of Patent: Oct. 23, 2001

(54) METHOD FOR PRODUCING A COOLING ELEMENT, AND A COOLING ELEMENT

(75) Inventors: Matti Smalén, Klaukkala; Erkki Miettinen, Helsinki, both of (FI)

(73) Assignee: ABB Industry Oy, Helsinki (FI)

( * ) Notice: Subject to any disclaimer, the term of this patent is extended or adjusted under 35 U.S.C. 154(b) by 0 days.

(21) Appl. No.: 09/463,903

(22) PCT Filed: Aug. 3, 1998

(86) PCT No.: PCT/FI98/00611
§ 371 Date: Apr. 5, 2000
§ 102(e) Date: Apr. 5, 2000

(87) PCT Pub. No.: WO99/08821
PCT Pub. Date: Feb. 25, 1999

(30) Foreign Application Priority Data

Aug. 14, 1997 (FI) ........................................ 973345

(51) Int. Cl.⁷ ................................................ H05K 7/20

(52) U.S. Cl. .................. 165/80.3; 165/185; 165/109; 29/890.03

(58) Field of Search ................... 165/185, 80.3; 164/109; 29/890.03

(56) References Cited

U.S. PATENT DOCUMENTS

| | | | |
|---|---|---|---|
| 4,785,522 | 11/1988 | Biro | 165/80.3 |
| 5,247,734 | * 9/1993 | Lubbe et al. | 29/890.045 |
| 5,533,257 | * 7/1996 | Romero et al. | 29/890.03 |
| 5,562,146 | 10/1996 | Harmon et al. | 164/112 |
| 6,003,586 | * 12/1999 | Beane | 164/63 |

* cited by examiner

*Primary Examiner*—Allen Flanigan
(74) *Attorney, Agent, or Firm*—Birch, Stewart, Kolasch & Birch, LLP

(57) ABSTRACT

A method for manufacturing cooling elements for power electronic components and other cooling devices for electronic appliances, wherein molten metal is fed into a closed mould including a core part and a mould part. The metal is allowed to become solid whereafter the finished casting is removed from the mould. An insert package is assembled of lamellas made from a material which at least essentially corresponds to the casting material by pressing together several lamellas arranged next to one another such that an air slot remains between the lamellas arrranged next to one another such that an air slot remains between the lamellas. This insert package is machined such that it fits into a recess in the core part and the insert and the insert package is placed in the recess in the core part before closing the mould, whereby the package is fastened to the casting once the mould has been filled.

8 Claims, 5 Drawing Sheets

METHOD FOR PRODUCING A COOLING ELEMENT, AND A COOLING ELEMENT

This application is the national phase under 35 U.S.C. §371 of PCT International Application No. PCT/FI98/00611 which has an International filing date of Aug. 3, 1998, which designated the United States of America.

BACKGROUND OF THE INVENTION

Field of the Invention

The present invention relates to method according to the preamble of claim 1 for manufacturing cooling elements for power electronic components and other electric appliances.

The invention also relates to a cooling element manufactured according to the invention.

Description of Background Art

Cooling elements for electric appliances are most commonly made of long, extruded aluminium profile cut into suitable lengths. By extruding, it is easy to produce many kinds of profiles, wherefore it is simple to produce a suitable profile for different intended uses, and in this manner, a large number of different kinds of cooling elements can be manufactured. However, elements made from extruded profile have a number of disadvantages relating particularly to the cooling of power electronic components. With modern components, high electric power can be handled with relatively small equipment. When such high power is led through a semiconductor component, naturally, power loss results, heating the component. This heat is generated within a small area and air cooling is usually employed to remove it. The heat transmission capacity of an air-cooled cooling component depends especially on the area of the surface to be cooled and on the distance from the heat source to the surface, i.e. the length of conduction. As the size of the element is as good as always restricted due to structural reasons, the cooling capacity of a cooler of certain dimensions depends on how large an area to be cooled can be packed into a certain volume. The cooling capacity can be essentially increased by means of a forced air flow, but the element must hereby be designed such that it does not prevent the flow of cooling air to the other elements.

Cooling elements are also manufactured by casting. Die casting, for example, can be applied to effectively and at a reasonable cost manufacture large numbers of cooling elements, wherefore this is an advantageous method for the series production of similar elements needed in large numbers. The casting can be shaped more freely than an extruded profile but because the fins of the cooling element must be shaped by means of the mould and cores placed in the mould, the maximum density of the fins as well as the thickness of the fins are restricted. All parts of the casting must have a certain cross-section to enable the filling of the mould and to prevent deformations occurring while the casting becomes solid from destroying the casting. The casting tool must withstand several castings and a hot casting alloy, wherefore there must not be any very thin surfaces in the mould, such surfaces being subject to rapid wear due to the stresses affecting the mould. Therefore, it is not possible to apply the present casting methods to manufacture cooling elements having a high fin density.

Cooling elements must be made of a material having good heat transmission properties. Thus, copper would constitute a good raw material for cooling elements but it is expensive and heavy, wherefore cooling elements are usually made of aluminium-based light metal alloys. As a rule, light metal alloys have good castability properties and are particularly suited for pressure die-casting.

SUMMARY AND OBJECTS OF THE INVENTION

The aim of the present invention is to provide a method for manufacturing cooling elements having a high fin density using pressure die-casting techniques.

The invention is based on placing an insert assembled of lamella sheets in the core of the casting mould and fixing the body of the cooling element to the lamella package by pressure moulding, whereby an integral element comprising a body and an array of cooling fins is formed.

In more detail, the method according to the invention is characterized by what is stated in the characterizing part of claim 1.

The invention offers considerable benefits.

The method according to the invention makes it possible to manufacture an array of cooling fins having a considerably higher density than one manufactured by conventional pressure moulding. This is of utmost importance because the ratio of the power handled by the power electronic components to the size of the components is on constant increase, wherefore a great cooling capacity must be fitted into a compact space. The body of the element is tightly adhered to the lamella package and thus, no air passage hampering the transmission of heat is formed between the body and the lamella package. Under advantageous conditions the surface of the lamella package can be melted by the aid of the casting material, thus forming a completely seamless piece. The insert and the casting material are of the same material or alloys of at least essentially similar type, preventing the generation of stresses due to the different thermal expansion of the materials in the casting. The production method is easily automated.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and of the scope of the invention will become apparent to those skilled in the art from thie detailed description.

BRIEF DESCRIPTION OF THE DRAWINGS

In the following, the invention is described in more detail with reference to the annexed drawings.

DETAILED DESCRIPTION OF THE INVENTION

Figure 1:
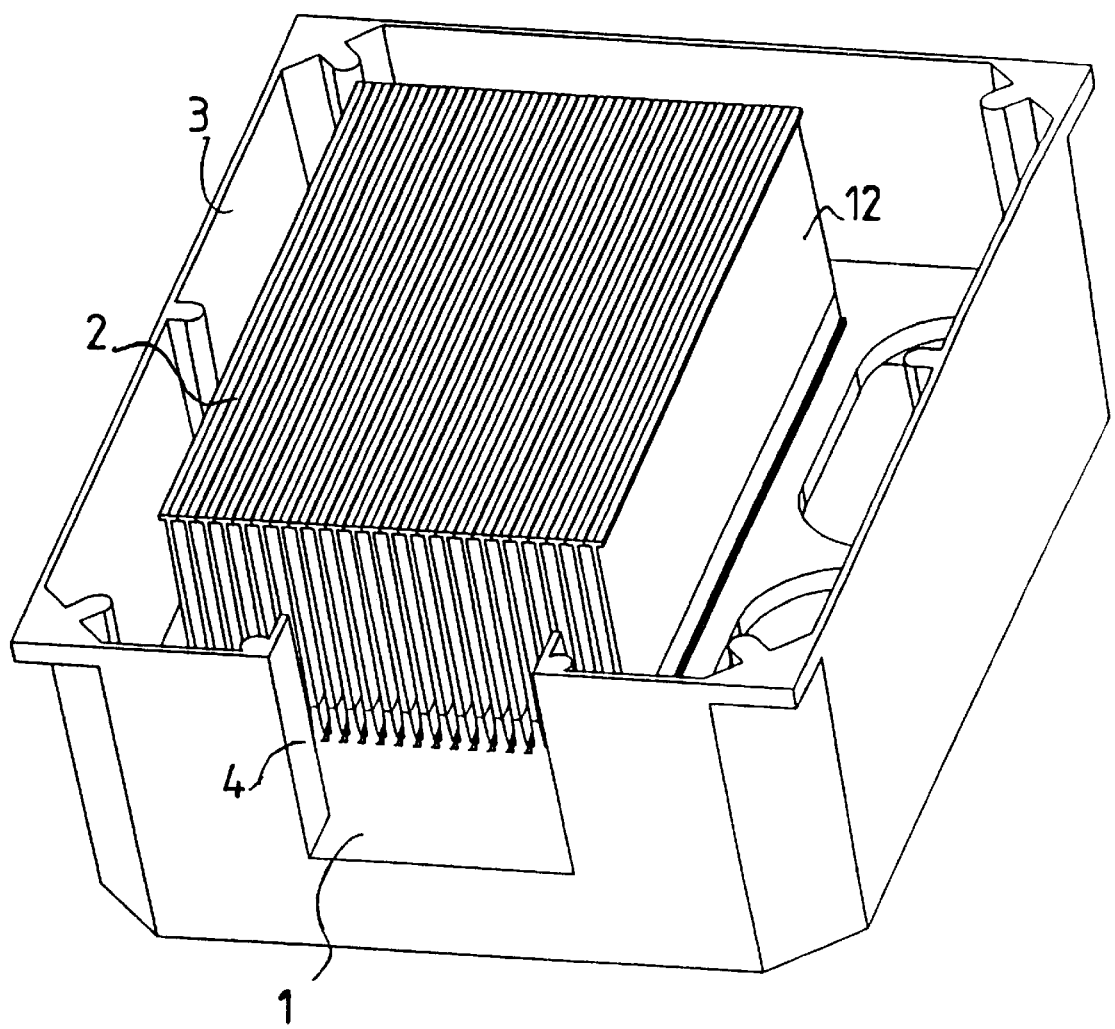
FIG. 1 is a perspective view of a cooling element according to the invention.
Figure 2:
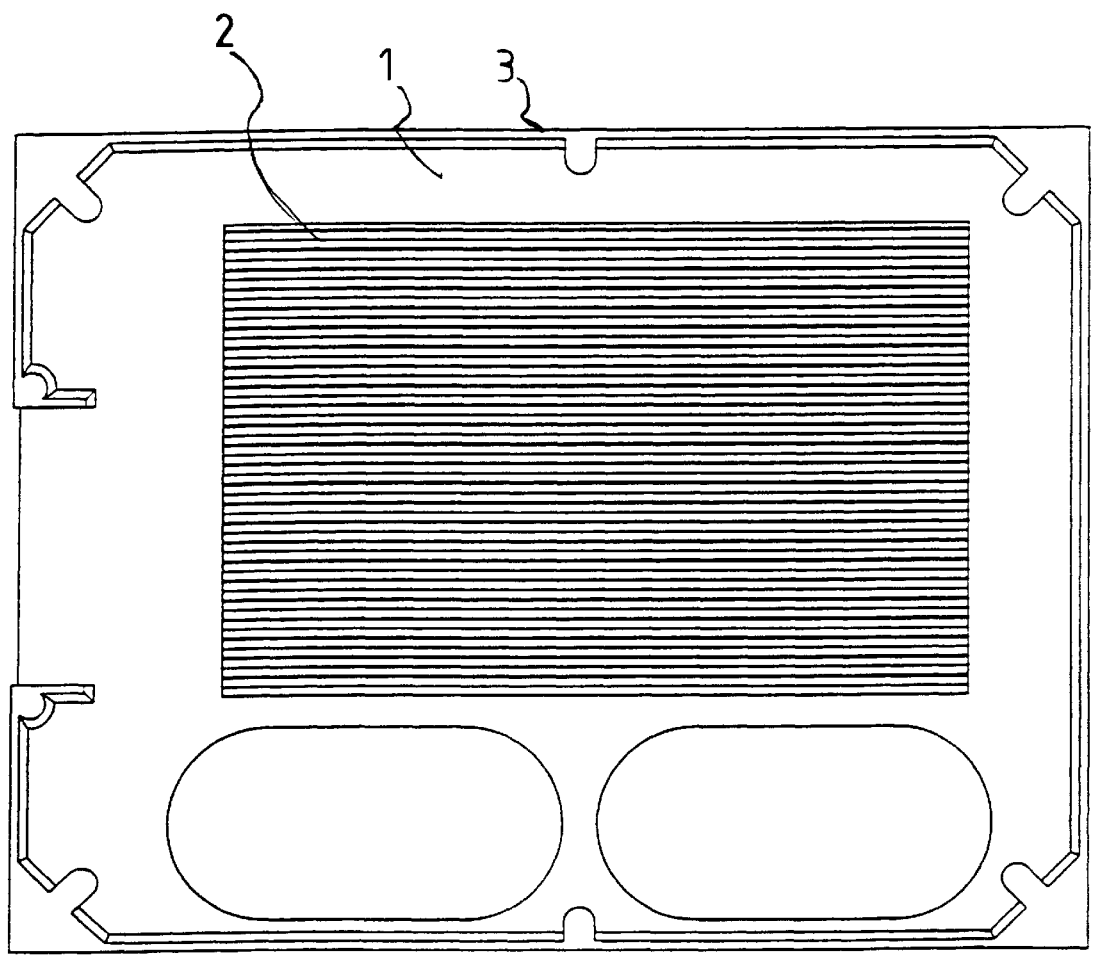
FIG. 2 is a top view of the element of FIG. 1.

The cooling element shown in FIGS. 1 and 2 consists of a body part 1 and an insert package 2 integrally connected thereto by casting, the package forming the cooling fins of the element. The cooling element is a box-like piece whose body 1 is along its edges encircled by a hem 3 forming the walls of the box. The insert package 2 is in the middle of the box and the upper surface of the package 2 is roughly at the height of the edges of the hem 3. The hem part 3 is provided with an opening 4 for the circulation of cooling air. As the invention does not concern the outer shape of the cooling element, only one possible construction is provided as an example here. It is clear that the invention can be applied to cooling elements of varying shapes.

Figure 3:
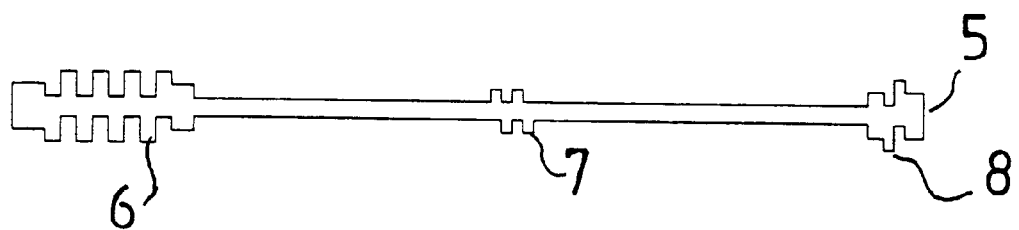
FIG. 3 depicts a single cooling fin.

The invention is based on connecting a prefabricated insert package 2 to a body 1 of the same or essentially the same material by casting. The insert package 2 is produced by pressing together lamellas 5 made from extruded aluminium profile to form a uniform block by means of a press connection. FIG. 3 depicts the structure of one lamella sheet. This lamella sheet 5 has toothings 6, 7, 8 at both of its edges, designed such that the teeth on opposite sides of the lamella intermesh, allowing the arrangement of lamellas next to each other such that the toothing of an adjacent lamella 5 fits the gaps between the teeth of the next lamella 5. The longest toothing 6 is provided at the edge which forms the bottom 9 of the insert package 2 and in addition, short toothings 7, 8 are provided in the middle of the lamella 5 and at the opposite edge. The insert package 2 is made of these lamelias 5 by pressing together a desired number of lamelias 5 arranged next to each other, whereby they are fastened to each other by means of a press connection. After having been joined together the lamella package and particularly its bottom 9 are meticulously machined to fit the core part 10 of the casting mould.

Figure 4:
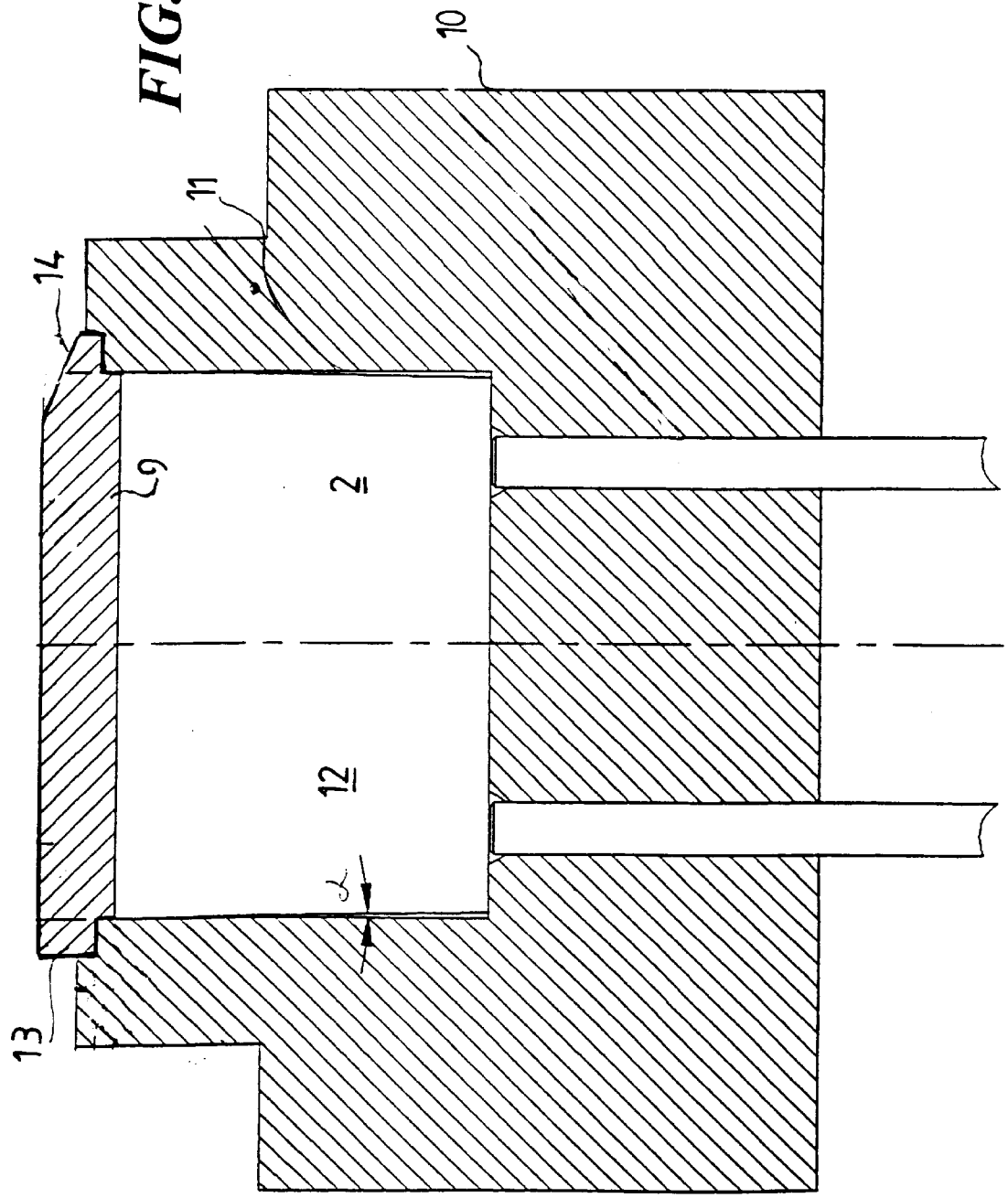
FIG. 4 is a cross section of the core part of the mould used in the production of the element, an insert package consisting of the fins of FIG. 1 having been placed therein.
Figure 5:
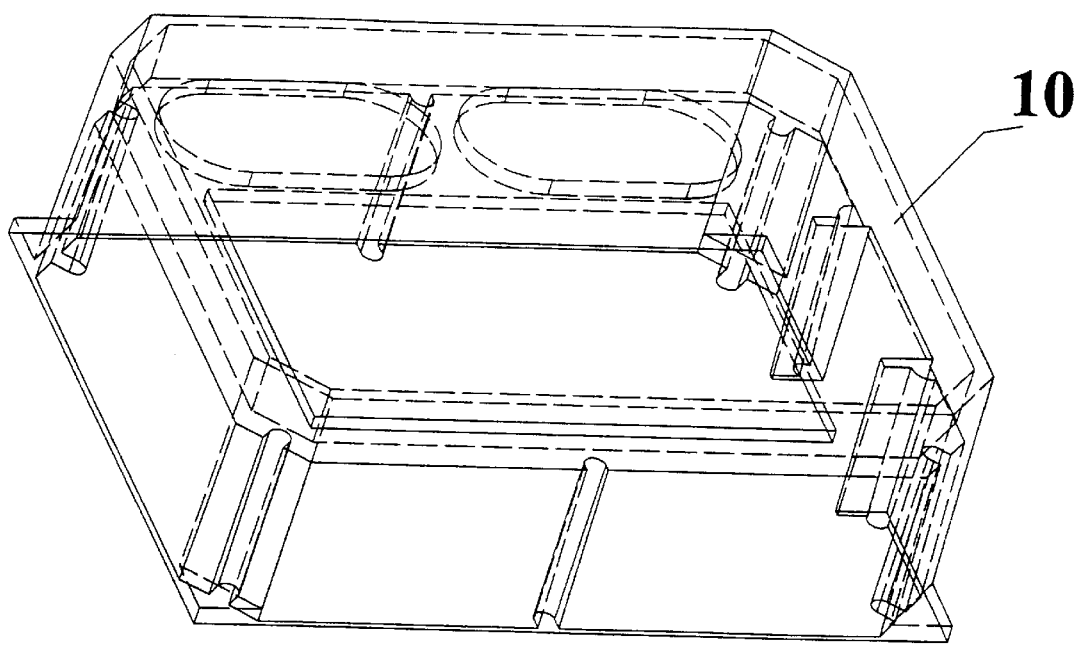
FIG. 5 is a perspective view of the core part of FIG. 4.

A cross-section of the core part 10 is shown in FIG. 4 and a perspective view in FIG. 5. What is essential in casting the element is that the joint between the core part 10 and the insert package must be sealed such that no molten casting metal can flow into the recess 11 for the insert package 2 and between the cooling lamellas. In the case of the core part 10 shown here, the sealing is carried out in three steps. The lamella part 12 of the insert package is machined to have a slightly tapered shape whereby it is tightly pressed into the rectangular recess. The coning angle must be small so as not to impair the detachment of a finished piece and even a small angle is sufficient to allow a good sealing effect. In this example the coning angle α is 1.0°. The bottom 9 of the insert package is machined to have a step in that it has a border which is broader than the lamella part 2. The core part 10 has a corresponding step-shaped recess into which the machined bottom part 9 of the insert package 2 can be exactly fitted. The outermost edge of the recess of the core part is bevelled whereby the outer edge of the bottom part 9 forms a tight cone joint even here. The coning angle β must be small because no such slit must be formed between the bottom 9 of the insert package and the core part 10 into which the molten metal could penetrate. Further on the incoming side of the melt the bottom part is provided with a bevelled edge 14 which facilitates the filling of the mould and the flow of the melt, in this example the melt flows as indicated by the arrow A.

The casting of a cooling element is performed such that an insert is placed in the mould, which is sealingly connected to the core part 2. The actual core part is not shown here but it is formed by a cavity which is shaped to correspond to the contour of the piece to be produced and which is arranged around the core part 10. Prior to the casting the mould is heated to a temperature of 200° C. and closed whereafter the mould is filled with a molten material corresponding to the material of the insert. The temperature of the cast melt is approximately 630° C. and the rate of casting is 25 m/s.

The bottom 9 of the insert is advantageously rather thick and massive because it must be capable of withstanding the thermal effect of the molten casting material without melting entirely. The bottom part of the above-described cooling element has a thickness of 21 mm and a gap of approximately 3 mm remains between the bottom part and the wall of a closed mould. Hereby the difference between the mass of the bottom 9 and that of the casting material is so great that there is no danger of the bottom 9 being molten away. The temperature of the melt and the mould is raised to such a high level that at least the surface of the bottom part 9 of the insert melts whereby the insert becomes part of the casting as the melt is solidified. However, a good joint is accomplished even when no essential melting of the insert occurs.

It goes without saying that the shape of the cooling element, the core part, the insert and the mould will vary according to the produced piece. The casting metal alloy and the material of the insert may vary but will most advantageously correspond to each other such that their melting points and mixture ratios are close to each other which makes it possible to connect the insert to the casting by melting the insert surface. The preheating temperature of the mould as well as the casting temperature of the melt vary according to the material cast but in the case of aluminium alloys the temperature of the mould should preferably be at least 200° C. and the temperature of the casting alloy 630° C. Higher temperatures will ensure the melting of the insert but, on the other hand, mould abrasion and other problems related to high casting temperatures are increased. In addition to aluminium alloys, e.g. magnesium alloys can be used, but the casting alloy and the insert must always have the same primary constituent.

The above-described sealing in three steps is not necessarily always needed between the insert and the core part if one sealing method achieves sufficient tightness. The structure of the sealing surface is to a great extent dependent of the structure of the element being produced.

According to the invention the insert can be arranged upside down in the moulding form. Based on simulations it would seem that the temperature of the thinner insert end will hereby rise to a temperature which is approximately 150° C. higher than that of the thicker insert end. In the simulation the insert/casting interface did not undergo any strong melting.

The invention being thus described, it will be obvious that the same may be varied in many ways. Such variations are not to be regarded as a departure from the spirit and scope for the invention, and all such modifications as would be obvious to one skilled in the art are intended to be included within the scope of the following claims.

What is claimed is:

1. A method for manufacturing cooling elements for power electronic components and other electric appliances, comprising fabricating an insert package (2) of lamellas (5) by pressing together several lamellas (5) next to each other such that an air slot remains between the lamellas, positioning the insert package (2) in a recess (11) in a core part of a mould before closing the mould, whereby the package is adhered to the casting once the mould has been filled, and feeding a molten metal which at least essentially corresponds to the material from which the insert package of lamellas is made into the closed mould comprising a core part (10) and a mould part, the molten metal being allowed to set, whereafter the finished casting is removed from the mould, characterized by machining the insert package (2) such that it fits into the recess (11) in the core part (10) and at least one machined surface of the package (2) forms a tight joint between the core part (10) and the insert.

2. The method of claim 1, characterized by heating the mould to at least 200° C., the casting temperature of the melt being at least 630° C.

3. The method of claim 1, characterized by designing the part of the insert package (2) which comes into contact with the molten casting material such that it is more massive than the part to be cast surrounding it in order to prevent the insert package from melting away.

4. The method of claim 1, characterized in that the insert package and the casting metal alloy are of aluminium alloys.

5. The method of claim 1, characterized by producing the insert package (2) of lamellas (5) made from aluminium profile, which lamellas (5) have toothings (6, 7, 8) at both of their edges, the toothing being designed such that the teeth on opposite sides of the lamella (5) intermesh whereby the lamellas can be arranged next to one another and the teeth (6, 7, 8) of adjacent lamellas (5) fit into the slots between the teeth (6, 7, 8) of the next lamella (5).

6. A cooling element comprising a body part (1) and an insert package (2) fastened thereto consisting of cooling lamellas (5), wherein the insert package (2) consists of lamellas (5) made from a material which at least essentially corresponds to the material of the body part (1), the insert package (2) having been assembled of lamellas by pressing together several lamellas (5) next to each other such that an air slot remains between the lamellas, and the body part (1) is cast around the insert package such that it encloses at least part of the insert package, characterized in that the insert package (2) comprises at least one machined surface such that it fits into a recess (11) in a core part of a mold (10) and the machined surface of the package (2) forms a tight joint between the core part (10) and the insert.

7. The cooling element of claim 6, characterized in that the insert package (2) consists of lamellas (5) made from aluminium profile, which lamellas (5) have toothings (6, 7, 8) at both of their edges, the toothing being designed such that the teeth on opposite sides of the lamella intermesh whereby the lamellas can be arranged next to one another and the teeth (6, 7, 8) of adjacent lamellas (5) fit into the slots between the teeth (6, 7, 8) of the next lamella.

8. The cooling element of claim 6, characterized in that the insert package (2) and the body part (1) are made of an aluminium alloy.

\* \* \* \* \*